US009418818B2

(12) United States Patent
Ominami et al.

(10) Patent No.: US 9,418,818 B2
(45) Date of Patent: Aug. 16, 2016

(54) CHARGED PARTICLE BEAM DEVICE AND SAMPLE OBSERVATION METHOD

(71) Applicant: Hitachi High-Technologies Corporation, Minato-ku, Tokyo (JP)

(72) Inventors: Yusuke Ominami, Tokyo (JP); Sukehiro Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/422,552

(22) PCT Filed: Jun. 28, 2013

(86) PCT No.: PCT/JP2013/067756
§ 371 (c)(1),
(2) Date: Feb. 19, 2015

(87) PCT Pub. No.: WO2014/030430
PCT Pub. Date: Feb. 27, 2014

(65) Prior Publication Data
US 2015/0228447 A1    Aug. 13, 2015

(30) Foreign Application Priority Data

Aug. 20, 2012 (JP) .................. 2012-181305

(51) Int. Cl.
*H01J 37/00* (2006.01)
*H01J 37/16* (2006.01)
(Continued)

(52) U.S. Cl.
CPC .................. *H01J 37/16* (2013.01); *H01J 37/00* (2013.01); *H01J 37/18* (2013.01); *H01J 37/20* (2013.01);
(Continued)

(58) Field of Classification Search
USPC .................................. 250/310, 306
See application file for complete search history.

(56) References Cited

U.S. PATENT DOCUMENTS 4,975,578 A * 12/1990 Tomimasu ............. G01N 23/04
                                                              250/307
5,051,585 A    9/1991 Koshishiba et al.
(Continued)

FOREIGN PATENT DOCUMENTS

| GB | 2 066 618 A | 7/1981 |
| JP | 2-15545 A | 1/1990 |

(Continued)

OTHER PUBLICATIONS

International Search Report (PCT/ISA/210) dated Aug. 27, 2013 with English translation (five pages).
(Continued)

Primary Examiner — Phillip A Johnston
(74) Attorney, Agent, or Firm — Crowell & Moring LLP

(57) ABSTRACT

A sample observation method includes irradiating a sample with a primary charged particle beam, detecting a secondary charged particle signal obtained by the irradiating, and observing the sample. The method is characterized by causing the primary charged particle beam generated in a charged particle optical lens barrel, which is maintained in a vacuum state, to be transmitted or passed through a separating film disposed to isolate a space in which the sample is placed from the charged particle optical lens barrel; and detecting a transmitted charged particle beam obtained by irradiating the sample, placed in an atmospheric pressure or a predetermined gas atmosphere of a slightly negative pressure state compared with the atmospheric pressure, with the primary charged particle beam.

18 Claims, 11 Drawing Sheets

(51) Int. Cl.
*H01J 37/18* (2006.01)
*H01J 37/20* (2006.01)
*H01J 37/244* (2006.01)
*H01J 37/28* (2006.01)
*H01J 37/26* (2006.01)

(52) U.S. Cl.
CPC ............... *H01J 37/244* (2013.01); *H01J 37/26* (2013.01); *H01J 37/28* (2013.01); *H01J 2237/2002* (2013.01); *H01J 2237/24455* (2013.01); *H01J 2237/2605* (2013.01)

(56) References Cited

U.S. PATENT DOCUMENTS

| | | | | |
|---|---|---|---|---|
| 5,811,803 | A * | 9/1998 | Komatsu | H01J 37/28 250/310 |
| 6,376,839 | B1 | 4/2002 | Hayles et al. | |
| 7,511,271 | B2 * | 3/2009 | Hatano | H01J 37/244 250/306 |
| 7,745,785 | B2 * | 6/2010 | Nishiyama | G01N 23/225 250/306 |
| 8,710,439 | B2 * | 4/2014 | Ominami | H01J 37/18 250/306 |
| 2004/0004183 | A1 * | 1/2004 | Grant | H01J 49/0409 250/281 |
| 2004/0046120 | A1 | 3/2004 | Moses et al. | |
| 2009/0166536 | A1 | 7/2009 | Suga et al. | |
| 2009/0242763 | A1 | 10/2009 | Buijsse | |
| 2010/0108881 | A1 * | 5/2010 | Toth | H01J 37/244 250/307 |
| 2011/0284745 | A1 | 11/2011 | Nishiyama et al. | |
| 2013/0313430 | A1 | 11/2013 | Ominami et al. | |

FOREIGN PATENT DOCUMENTS

| | | |
|---|---|---|
| JP | 10-283978 A | 10/1998 |
| JP | 2002-533903 A | 10/2002 |
| JP | 2009-158222 A | 7/2009 |
| JP | 2009-245944 A | 10/2009 |
| JP | 2011-129343 A | 6/2011 |
| WO | WO 2010/001399 A1 | 1/2010 |
| WO | WO 2012/104942 A1 | 8/2012 |

OTHER PUBLICATIONS

Japanese-language International Preliminary Report on Patentability (PCT/IPEA/409) dated Nov. 29, 2013 (five pages).
German Office Action dated Mar. 31, 2015 with partial English-language translation (seven (7) pages).

* cited by examiner

FIG. 5
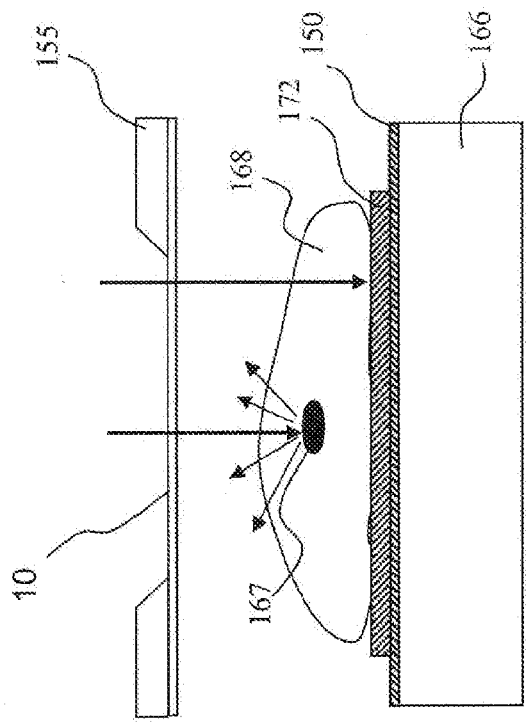
(b)
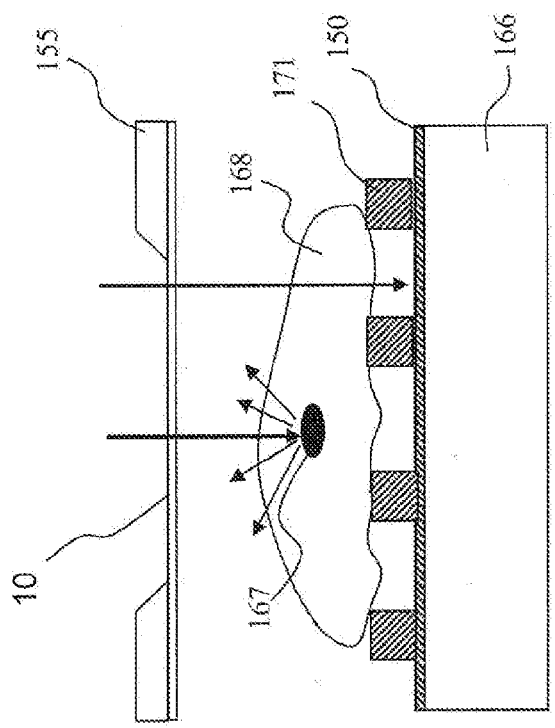
(a)

CHARGED PARTICLE BEAM DEVICE AND SAMPLE OBSERVATION METHOD

TECHNICAL FIELD

The present invention relates to a charged particle beam device capable of observing a sample under the atmospheric pressure or a predetermined gas atmosphere of a slightly more negative pressure state than the atmospheric pressure.

BACKGROUND ART

In order to observe a fine region of an object, a scanning electron microscope (SEM), a transmission electron microscope (TEM) and the like are used. Generally, in these devices, a housing in which the sample is disposed is evacuated so as to render the sample atmosphere into a vacuum state in which to image the sample. In this case, however, a biochemical sample, a liquid sample and the like may be damaged or turned into a different state by the vacuum. Meanwhile, there is much need for observing such samples using the electron microscope, and SEM devices and sample holder devices that enable observation of the sample as the object of observation in the atmospheric pressure have been developed in recent years.

These devices are in principle configured such that a separating film or a fine through hole through which an electron beam can be transmitted is disposed between an electron optical system and the sample to separate a vacuum state from the atmosphere state. The devices are similar in that the separating film is disposed between the sample and the electron optical system.

For example, Patent Literature 1 discloses an SEM in which the electron source side of an electron optical lens barrel is disposed downward and the objective lens side thereof is disposed upward, with the separating film through which the electron beam can be transmitted being disposed over an electron beam emission opening at the distal end of the electron optical lens barrel via O-rings. According to the invention described in this literature, a sample as the object of observation is directly placed on the separating film, and the sample is irradiated with a primary electron beam from a lower surface of the sample. Reflected electrons or secondary electrons are then detected to perform SEM observation. The sample is held in a space formed by the separating film and an annular member installed around the separating film, the space being filled with liquid such as water.

CITATION LIST

Patent Literature

Patent Literature 1: JP 2009-158222 A (Specification of U.S. Patent Application Publication No. 2009/0166536)

SUMMARY OF INVENTION

Technical Problems

The conventional charged particle beam devices are manufactured specially for observation under the atmospheric pressure or a gas atmosphere having a pressure substantially equivalent to the atmospheric pressure. There have been no devices that enable simple observation using the normal high-vacuum type charged particle microscope under the atmospheric pressure or a gas atmosphere having a pressure substantially equivalent to the atmospheric pressure.

For example, the SEM described in Patent Literature 1 is a structurally highly specialized device, and cannot perform SEM observation in a normal high vacuum atmosphere.

Further, in the method according to the conventional art, a charged particle beam emitted from or reflected by the sample is detected. In this case, while the sample surface shape can be observed, the inside of the sample cannot be observed.

The present invention was made in view of the above problems, and has the object of providing a charged particle beam device that enables observation of a sample in the atmospheric atmosphere or a gas atmosphere without greatly modifying the configuration of the conventional high-vacuum type charged particle microscope, and that enables observation of the inside of the sample.

Solution to the Problem

In order to solve the problems, the configurations described in the claims are adopted, for example.

While the present application includes a plurality of means for solving the problems, one example includes a charged particle optical lens barrel that irradiates a sample with a primary charged particle beam; a vacuum pump that evacuates the inside of the charged particle optical lens barrel; a detachable separating film that is disposed to isolate a space in which the sample is placed from the charged particle optical lens barrel, and that transmits or passes the primary charged particle beam; and a detector that is placed on an opposite side of the separating film with respect to the sample, and that detects a transmitted charged particle beam obtained by the irradiation of the sample with the charged particle beam.

Advantageous Effects of Invention

According to the present invention, there can be provided a charged particle beam device capable of observing a sample in the atmospheric atmosphere or a gas atmosphere without greatly modifying the configuration of the conventional high-vacuum type charged particle microscope, and capable of observing the inside of the sample.

BRIEF DESCRIPTION OF DRAWINGS

FIGS. 5A and 5B are detail views of a system for not directly placing the sample on the detector.

DESCRIPTION OF EMBODIMENTS

In the following, embodiments will be described with reference to the drawings.

In the following, a charged particle beam microscope will be described as an example of a charged particle beam device. However, this is merely an example of the present invention, and the present invention is not limited to the embodiments described below. The present invention may be applied to a scanning electron microscope, a scanning ion microscope, a scanning transmission electron microscope, a device combining the above with a sample processing device, or an analyzer/inspection device in which the above are applied.

In the present specification, "the atmospheric pressure" refers to an atmospheric atmosphere or a predetermined gas atmosphere, i.e., a pressure environment of the atmospheric pressure or a slightly negative pressure state. Specifically, the atmospheric pressure is on the order of approximately $10^5$ Pa (atmospheric pressure) to $10^3$ Pa.

FIRST EXAMPLE

Figure 1:
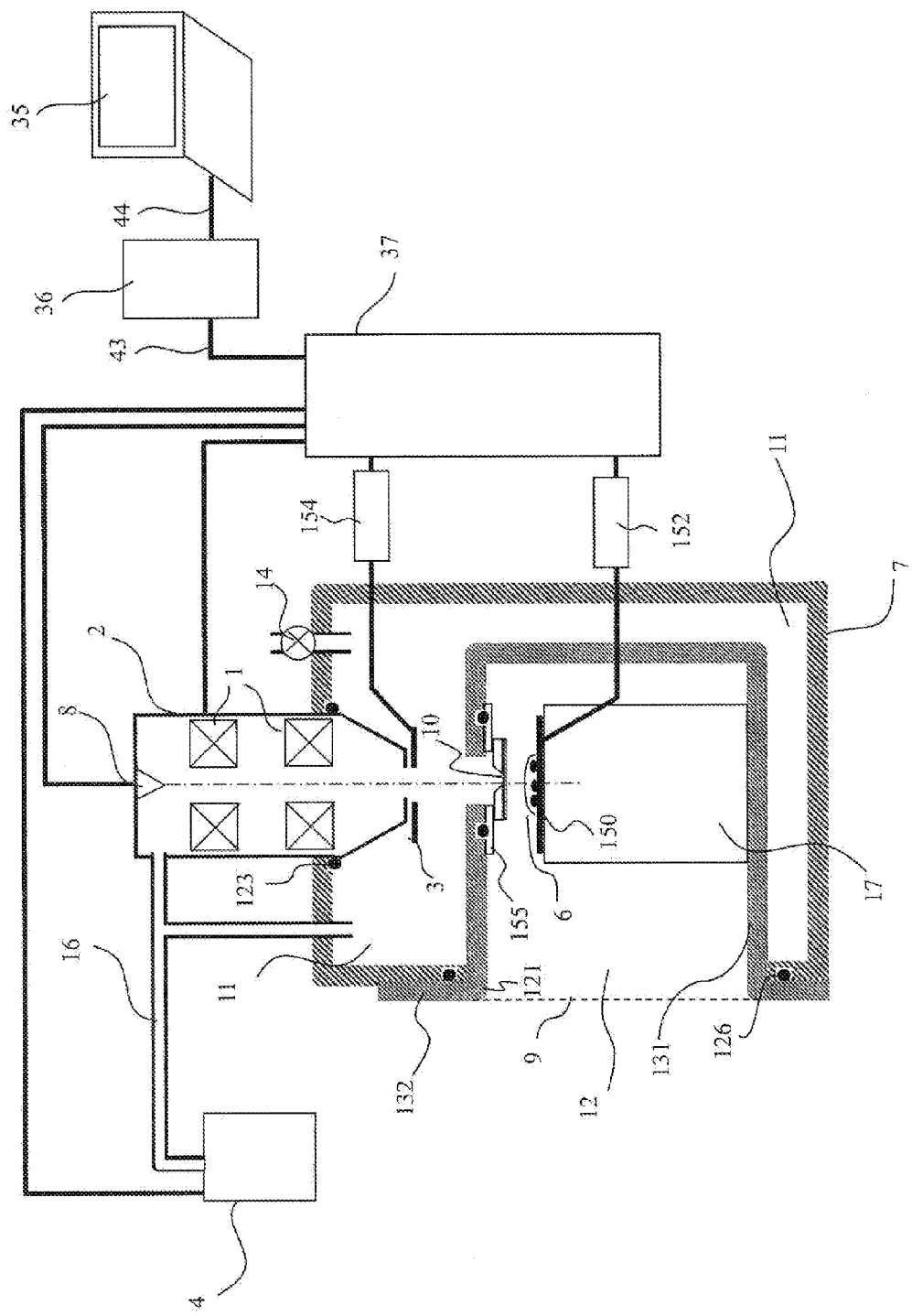
FIG. 1 is an overall configuration diagram of a charged particle microscope according to a first example.

In the present example, a basic embodiment will be described. FIG. 1 is an overall configuration diagram of the charged particle microscope according to the present example. The charged particle microscope illustrated in FIG. 1 mainly includes a charged particle optical lens barrel 2; a first housing 7 (which may be hereafter referred to as a vacuum chamber) supporting the charged particle optical lens barrel with respect to a device installation surface; a second housing 121 (which may be hereafter referred to as an attachment) used by being inserted into the first housing 7; and a control system controlling the above. When the charged particle microscope is used, the insides of the charged particle optical lens barrel 2 and the first housing 7 are evacuated by a vacuum pump 4. Operations for starting or stopping the vacuum pump 4 are also controlled by the control system. While in the drawing there is shown only one vacuum pump 4, there may be two or more vacuum pumps.

The charged particle optical lens barrel 2 includes various elements such as a charged particle source 8 that generates a charged particle beam, and an optical lens 1 that focuses and guides the generated charged particle beam under the lens barrel so as to scan the sample 6 with the charged particle beam as a primary charged particle beam. The charged particle optical lens barrel 2 is installed in such a manner as to jut into the first housing 7, and is affixed to the first housing 7 via a vacuum seal member 123. At the end of the charged particle optical lens barrel 2, there is disposed a detector 3 for detecting secondary charged particles (such as secondary electrons or reflected electrons) obtained by the primary charged particle beam irradiation. Further, a detector 150 is provided under the sample inside the second housing 121.

The charged particle microscope according to the present example includes, as a control system, a computer 35 used by a device user; an upper-level control unit 36 connected to and communicating with the computer 35; and a lower-level control unit 37 that controls an evacuation system, a charged particle optical system and the like in accordance with a command transmitted from the upper-level control unit 36. The computer 35 includes a monitor that displays a device operation screen (GUI), and an operation screen input means, such as a keyboard and mouse. The upper-level control unit 36, the lower-level control unit 37, and the computer 35 are connected by communication lines 43 and 44.

The lower-level control unit 37 is a portion that transmits and receives control signals for controlling the vacuum pump 4, the charged particle source 8, the optical lens 1 and the like. The lower-level control unit 37 also converts an output signal from the detector 3 into a digital image signal and transmits the converted signal to the upper-level control unit 36. In the figure, output signals from the detector 3 and the detector 150 are connected to the lower-level control unit 37 via amplifiers 152 and 154, such as pre-amplifiers. The amplifiers may not be provided if not required.

In the upper-level control unit 36 and the lower-level control unit 37, analog circuits, digital circuits and the like may be mixed. The upper-level control unit 36 and the lower-level control unit 37 may be integrated. The configuration of the control system illustrated in FIG. 1 is merely an example. The charged particle beam microscope according to the present example may include various modifications of the control unit, valves, the vacuum pump, communication wiring and the like as long as the intended functions of the present example are satisfied.

To the first housing 7, there is connected a vacuum piping 16 of which one end is connected to the vacuum pump 4 so that the inside of the first housing can be maintained in a vacuum state. There is also provided a leak valve 14 for opening the inside of the housing to the atmosphere, so that the inside of the first housing 7 can be opened to the atmosphere during maintenance, for example. The leak valve 14 may not be provided, or two or more leak valves may be provided. The location of the leak valve 14 in the first housing 7 is not limited to the location shown in FIG. 1. The leak valve 14 may be disposed at another position on the first housing 7. Further, the first housing 7 is provided with an opening portion in a side surface via which the second housing 121 is inserted.

The second housing 121 includes a cuboidal body portion 131 and a mating portion 132. As will be described below, at least one of the side surfaces of the cuboid of the body portion 131 constitutes an open surface 9. The side surfaces of the cuboid of the body portion 131 other than the surface on which a separating film holder member 155 is installed may be constituted by the walls of the second housing 121. Alternatively, the second housing 121 may not have walls by itself, and may be formed by the side walls of the first housing 7 with the second housing 121 being assembled in the first housing 7. The body portion 131 is inserted into the first housing 7 via the opening portion and, once assembled in the first housing 7, provides the function of storing the sample 6 as the object of observation. The mating portion 132 constitutes a mating surface with an outer wall surface of the first housing 7 on the side on which the opening portion is provided, and is affixed to the outer wall surface on the side via a vacuum seal member 126. Thus, the second housing 121 as a whole is fitted in the first housing 7. The opening portion may be most simply manufactured by utilizing a sample loading/unloading opening with which the vacuum sample chamber of the charged particle microscope is originally provided. Specifically, the second housing 121 may be manufactured in accordance with the size of the originally provided hole, and then the vacuum seal member 126 may be attached to the periphery of the hole. In this way, modification of the device can be minimized. The second housing 121 is detachable from the first housing 7.

On the upper surface side of the second housing 121, there is provided a separating film 10 at a position immediately under the charged particle optical lens barrel 2 when the second housing 121 as a whole is fitted in the first housing 7. The separating film 10 is capable of transmitting or passing the primary charged particle beam emitted from the lower end of the charged particle optical lens barrel 2. The primary charged particle beam finally reaches the sample 6 via the separating film 10.

According to the conventional art, the sample is held inside the separating film filled with liquid. Because the sample becomes wet once atmospheric pressure observation is conducted, it has been very difficult to observe the sample of the same state in both the atmospheric atmosphere and a high vacuum atmosphere. Further, because the liquid is in contact with the separating film at all times, the probability of the separating film being damaged is very high. In contrast, in the system according to the present example, the sample 6 is disposed in a state not in contact with the separating film 10. Thus, the sample can be observed under both a high vacuum and the atmospheric pressure without changing the sample state. In addition, the sample is not placed on the separating film, so the probability of the separating film being damaged by the sample can be decreased.

The charged particle beam that has reached the sample 6 causes emission of a secondary charged particle beam of reflected charged particles, transmitted charged particles and the like from the inside or surface of the sample. The secondary charged particles are detected by the detector 3 or the detector 150. Because the detector 3 is disposed on the sample surface side that is irradiated with the charged particles, sample surface information can be acquired. On the other hand, the detector 150 is disposed on the side opposite to the sample surface irradiated with the charged particles; namely, the sample is disposed between the charged particle beam source and the detector 150. Thus, the detector 150 can detect a transmission signal, enabling the acquisition of information about the inside of the sample.

The detector 3 and the detector 150 are detection elements that can detect the charged particles flying with an energy on the order of several keV to several tens of keV. The detection elements may include a signal amplification means. Preferably, the detection elements are thin and flat in view of device configuration requirements. Examples include a semiconductor detector made from a semiconductor material such as silicon, and a scintillator that can convert the charged particle signal into light on a glass surface or inside of the scintillator.

When the charged particle beam is an electron beam, the separating film 10 needs to have a thickness such that the electron beam can pass through the film, typically on the order of 20 μm or less. Instead of the separating film, an aperture member including a passage hole for the primary charged particle beam may be used. In this case, preferably, the hole size is equal to or less than an area of the order of 1 mm$^2$ in view of the requirement for the ability for differential evacuation using a realistic vacuum pump. When the charged particle beam is an ion, it is difficult to penetrate the separating film without damaging the film. Thus, an aperture of an area on the order of 1 mm$^2$ or less is used. In the figure, the dashed line indicates the optical axis of the primary charged particle beam. The charged particle optical lens barrel 2 and the separating film 10 are disposed coaxially with the optical axis of the primary charged particle beam. The distance between the sample 6 and the separating film 10 is adjusted by placing a sample base 17 at an appropriate height.

As illustrated in FIG. 1, a side surface of the second housing 121 is the open surface 9 providing communication with the atmosphere space and of a size enabling the loading and unloading of at least the sample. The sample 6 stored inside the second housing 121 (to the right of the dotted line in the figure; hereafter referred to as a second space) is placed in an atmospheric pressure state during observation. FIG. 1 is a cross sectional view of the device taken in a direction parallel with the optical axis. Thus, the open surface 9 is shown only in one surface. However, the open surface 9 of the second housing 121 is not limited to the one surface as long as the second housing is vacuum-sealed by the side surfaces of the first housing in the depth direction and the forward direction of the sheet of FIG. 1. It is only necessary that there is at least one open surface when the second housing 121 is assembled in the first housing 7. To the first housing 7, the vacuum pump 4 is connected, so that a closed space (hereafter referred to as a first space) formed by the inner wall surfaces of the first housing 7, the outer wall surfaces of the second housing, and the separating film 10 can be evacuated. Thus, in the present example, the first space 11 is maintained at high vacuum by the separating film 10, while the second space 12 is maintained at the atmospheric pressure or a gas atmosphere of a pressure substantially equivalent to the atmospheric pressure. Accordingly, the charged particle optical lens barrel 2 and the detector 3 can be maintained in vacuum state during device operation, while the sample 6 can be maintained in the atmospheric pressure.

In the conventional technology where the atmospheric atmosphere can be locally maintained, such as in an environmental cell, observation in the atmospheric pressure/gas atmosphere can be performed. However, only samples of sizes that enable insertion into the cell can be observed, and large-sized samples cannot be observed in the atmospheric pressure/gas atmosphere. Further, in the case of the environmental cell, in order to observe a different sample, it is necessary to remove the environmental cell from the SEM vacuum sample chamber, and to re-load the cell into the vacuum sample chamber after replacing the sample, creating the problem of cumbersome sample replacement. In contrast, in the system according to the present example, one side surface of the second housing 121 is opened, and the sample 6 is placed in the second space 12, which is a large atmospheric pressure space. Thus, a large-sized sample such as a semiconductor wafer can be observed under the atmospheric pressure. Particularly, the size of the second housing according to the present example can be easily increased because the system enables insertion via the side surface of the sample chamber. Accordingly, even a large sample that cannot be sealed in the environmental cell can be observed. Further, because the second housing 121 has the open surface, the sample can be moved between the inside and the outside of the second space 12 during observation, enabling easy sample replacement.

Figure 2:
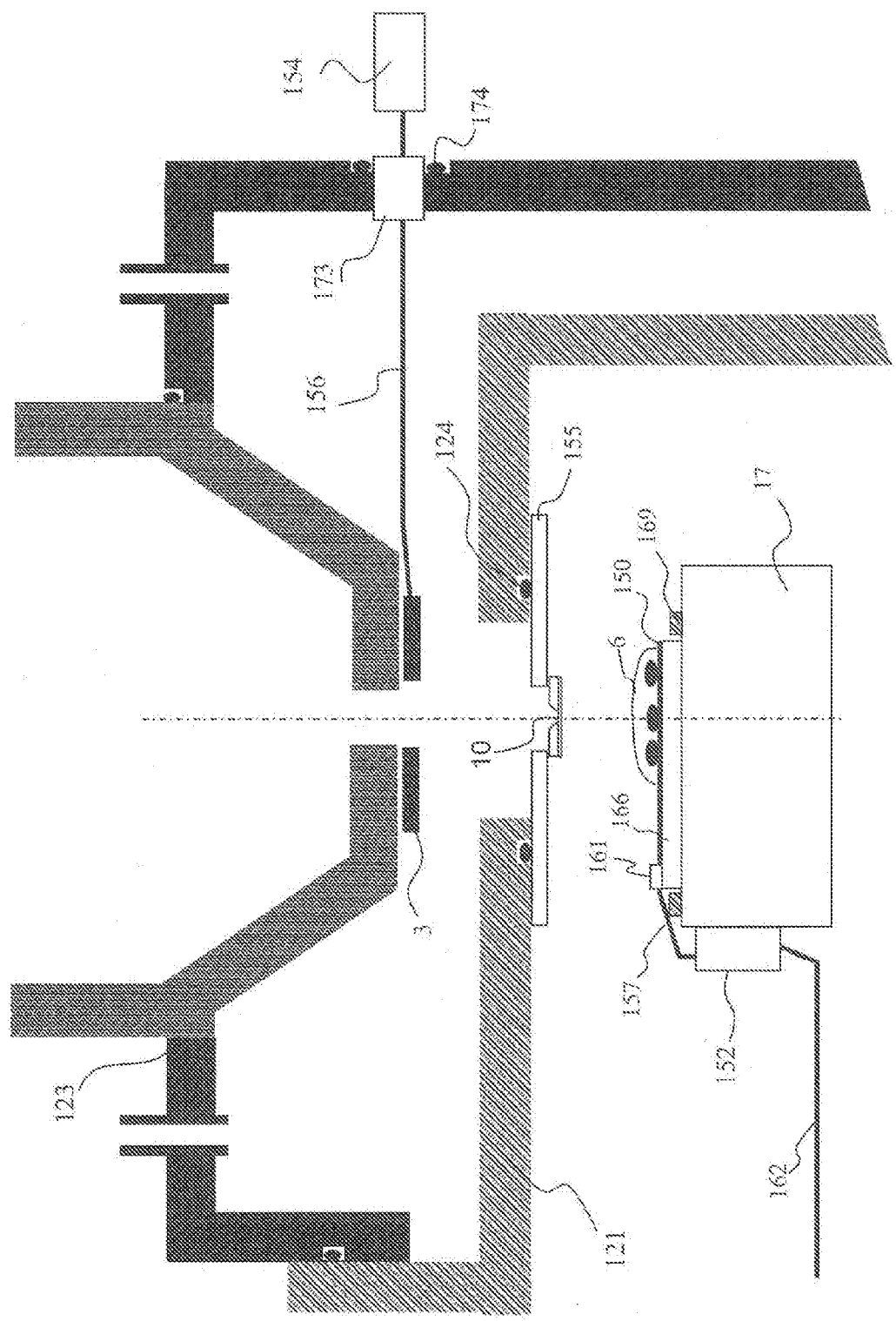
FIG. 2 is a detail view in the vicinity of a separating film, a sample, and a detector.

FIG. 2 is a detail view in the vicinity of the detector 3, the separating film 10, the sample 6, and the detector 150. The separating film 10 is disposed on the separating film holder member 155. While not shown, it is assumed that the separating film 10 and the separating film holder member 155 are adhered to each other with a vacuum-sealable adhesive, a double-sided tape and the like.

A detection signal from the detector 3 disposed at the end of the charged particle optical lens barrel 2 is sent to the signal amplifier 154 via a signal line 156 and a hermetic connector 173 vacuum-sealed with a vacuum-seal portion 174. While the signal amplifier 154 is shown disposed outside the device, the signal amplifier 154 may be disposed inside the vacuum near the detector 3.

The sample 6 is disposed on the detector 150. The detector 150 is disposed on a detector holder base 166. A detection signal from the detector 150 is connected to the signal amplifier 152 via a connector 161 and a signal line 157 which may include a cable. The detector holder base 166 and the sample base 17 may or may not be affixed by a convex member 169 or a fixing metal fitting (not shown) disposed on the sample base 17. If the position of the detector 150 and the detector holder base 166 is displaced by movement of the sample base 17, such affixing may be effective.

The detector holder base 166 provided with the detector 150 is detachable. When the sample 6 is mounted, the sample 6 is disposed on the detector 150 on the detector holder base 166 outside the device. Then, the detector holder base 166 is mounted on the sample base 7. Thereafter, connection to the signal amplifier 152 that has been disposed inside the device in advance is made using the signal line 157. The detector holder base 166 is then placed inside the device, i.e., inside the second housing, when the sample 6 can be irradiated with the charged particle beam passing through the separating film 10.

When no signal is acquired by the detector 150, the detector 150 and the detector holder base 166 may be detached, and the sample 6 may be directly disposed on the sample base 17. While the detector 150 herein refers to a detection element, the detector 150 and the detector holder base 166 that are integrated may be referred to as a detector in the present specification.

Because the sample 6 under the atmospheric pressure is placed on the detector, a charged particle microscope can be realized that can observe the inside of the sample under the atmospheric pressure or a gas atmosphere of a pressure substantially equivalent to the atmospheric pressure more easily than according to the conventional art.

FIG. 3(a) illustrates the detector 150 on which the sample 6 is mounted and peripheral structures. The signal from the detector 150 is output via the signal line 163 to the connector 161. The detector 150 is a semiconductor detector made from silicon, for example, as mentioned above. The detector 150 may be a scintillator that converts the charged particle beam into light. As illustrated in FIG. 3(b), the detector 150 may be disposed in a plurality of areas, such as four areas, instead of one. The sample 6 is disposed on the detector 150, as illustrated in FIG. 3(c), for example. In the figure, four samples are disposed on four detection areas. Generally, semiconductor detectors and the like that have a large area have a large parasitic capacity, and as a result the signal bandwidth of the detection signal may become narrowed. Thus, by dividing the detection element surface as illustrated in FIG. 3(b), the signal bandwidth of the detection signal can be expanded. When there is a plurality of samples, for example, each sample may be disposed on a respective detector, as illustrated in FIG. 3(c), whereby it can be readily identified which sample is disposed at which position, for example.

When a scintillator is used, the detector 150 may be an optical converter unit that converts the charged particle beam into light, and the wiring 163 may be an optical waveguide, such as a transparent glass. Following the connector 161, a photomultiplier for amplifying and converting the light into electronic information may be connected.

The detector 150 may include a detector that detects not only the charged particle beam of ions, electrons and the like, but also photons or X-ray and the like emitted from the sample. The detector 150 may also include a detector such as a multi-channel plate or an ionization chamber which are included in the scope of the charged particle beam microscope according to the present example as long as the intended functions of the present example can be satisfied.

Next, with reference to FIG. 4, the difference in signal between when the detector 150 and the sample are close to each other and when the detector 150 and the sample are spaced apart from each other will be described. Here, it is considered that in the sample there are a high density location 167 and a low density location 168. In FIG. 4(a), a case is considered where the detector 150 and the sample are close to each other. When the high density location 167 in the sample is irradiated with the primary charged particle beam 159, most of the charged particle beam is rearwardly scattered, so that the charged particle beam does not reach the detector 150. On the other hand, when the low density location 168 in the sample is irradiated with the primary charged particle beam 159, the charged particle beam can be transmitted to the detector 150. As a result, a density difference inside the sample can be detected in the detector 150. Here, because the area under the separating film 10 in the figure is the atmosphere space, it is preferable that the separating film 10 and the sample are disposed as close to each other as possible so as to prevent the charged particle beam from being scattered.

A case is considered in which, as illustrated in FIG. 4(b), the sample 6 is mounted on a support base 170, and the sample 6 and the detector 150 are spaced apart from each other. In this case, the charged particle beam with which the high density location 167 in the sample is irradiated is mostly rearwardly scattered, while the transmitted charged particle beam transmitted through the low density location 168 are scattered by the atmosphere space before reaching the detector 150. As a result, it becomes more difficult to detect information of the inside of the sample using the detector 150 than in the case of FIG. 4(a). For this reason, when the information of the inside of the sample is detected, it is preferable to make the distance between the sample and the detector 150 smaller than the distance at which most of the transmitted charged particle beam is scattered. Namely, it is necessary to shorten the mean free path of the transmitted charged particle beam. The distance between the separating film and the sample, and the allowable distance between the sample and the detector, may vary depending on irradiation conditions such as the acceleration voltage of the charged particle beam. Realistically, however, the distances need to be not more than 1 mm, for example. Thus, it is particularly preferable to dispose the sample directly on the detector 150, as illustrated in FIG. 4(a).

The system in which the sample is not directly disposed on the detector is illustrated in FIG. 5(a). In the figure, the sample is disposed on a meshed member 171. The meshed member 171 is disposed on the detector 150. On the meshed member 171, the sample 6 is disposed. The distance between the sample lower surface and the detector 150 is determined by the thickness of the meshed member 171. When the thickness is small, the charged particle beam can reach the detector 150 without being scattered as illustrated in FIG. 4(b). The thickness may be generally equal to or less than 100 μm. As illustrated in FIG. 5(b), a foil or film 172 may be disposed on the detector instead of the mesh, and the sample 6 may be disposed on the foil or film. The thickness may be generally equal to or less than 100 μm. The foil or film 172 may be vapor-deposited or adhered on the detector 150 in advance, or the foil or film 172 may be separated. Preferably, the meshed member 171 or the foil or film 172 is an electrically conductive metal material so that no charging is caused by the charged particle beam. However, the meshed member 171 or the foil or film 172 may be a semiconductor or an insulator so thin that no charging is caused. In any case, the thinner the mesh or the foil or film is, the easier the detection by the detector 150 becomes.

Figure 3:
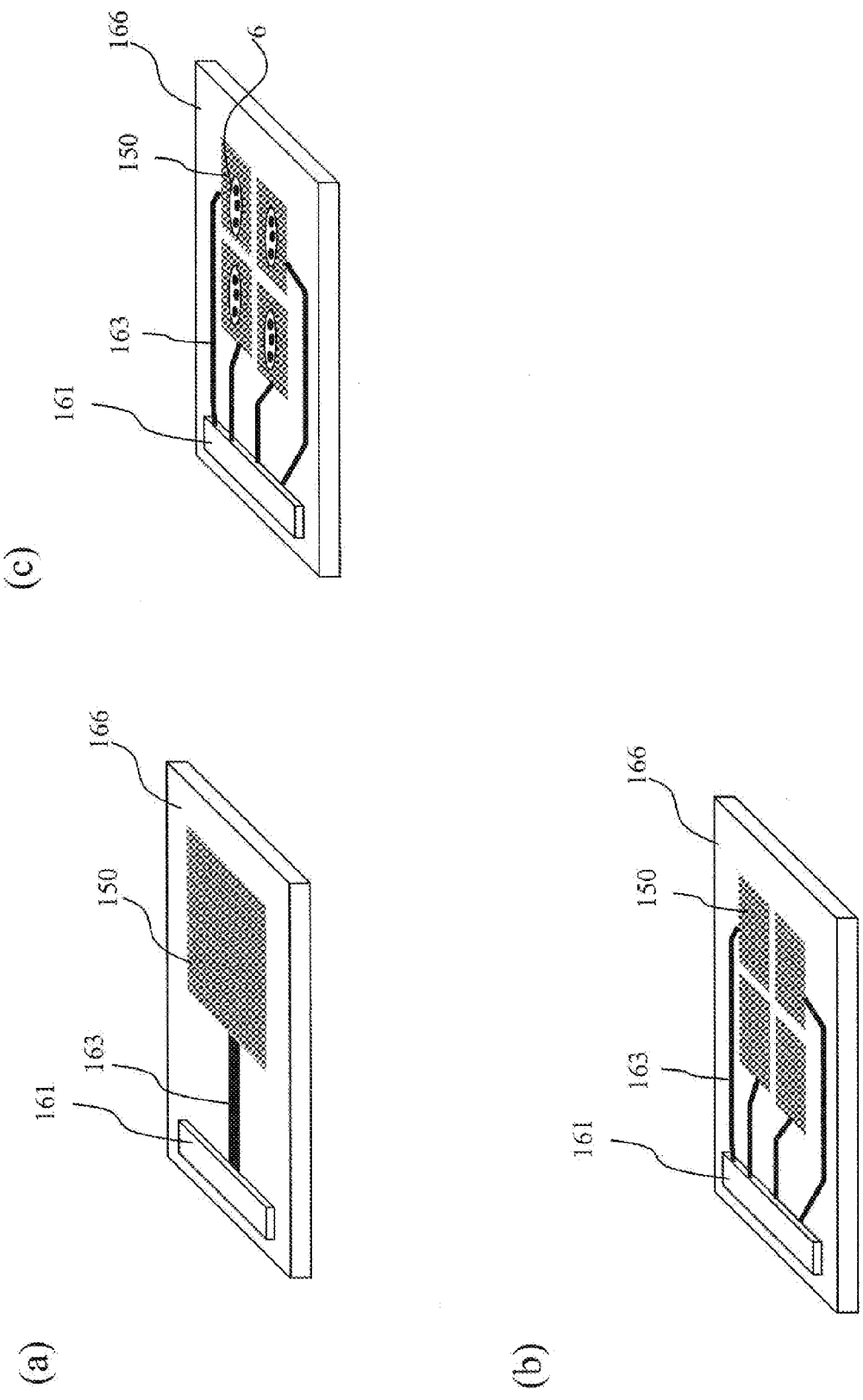
FIGS. 3A-3C are detail views of the detector.
Figure 4:
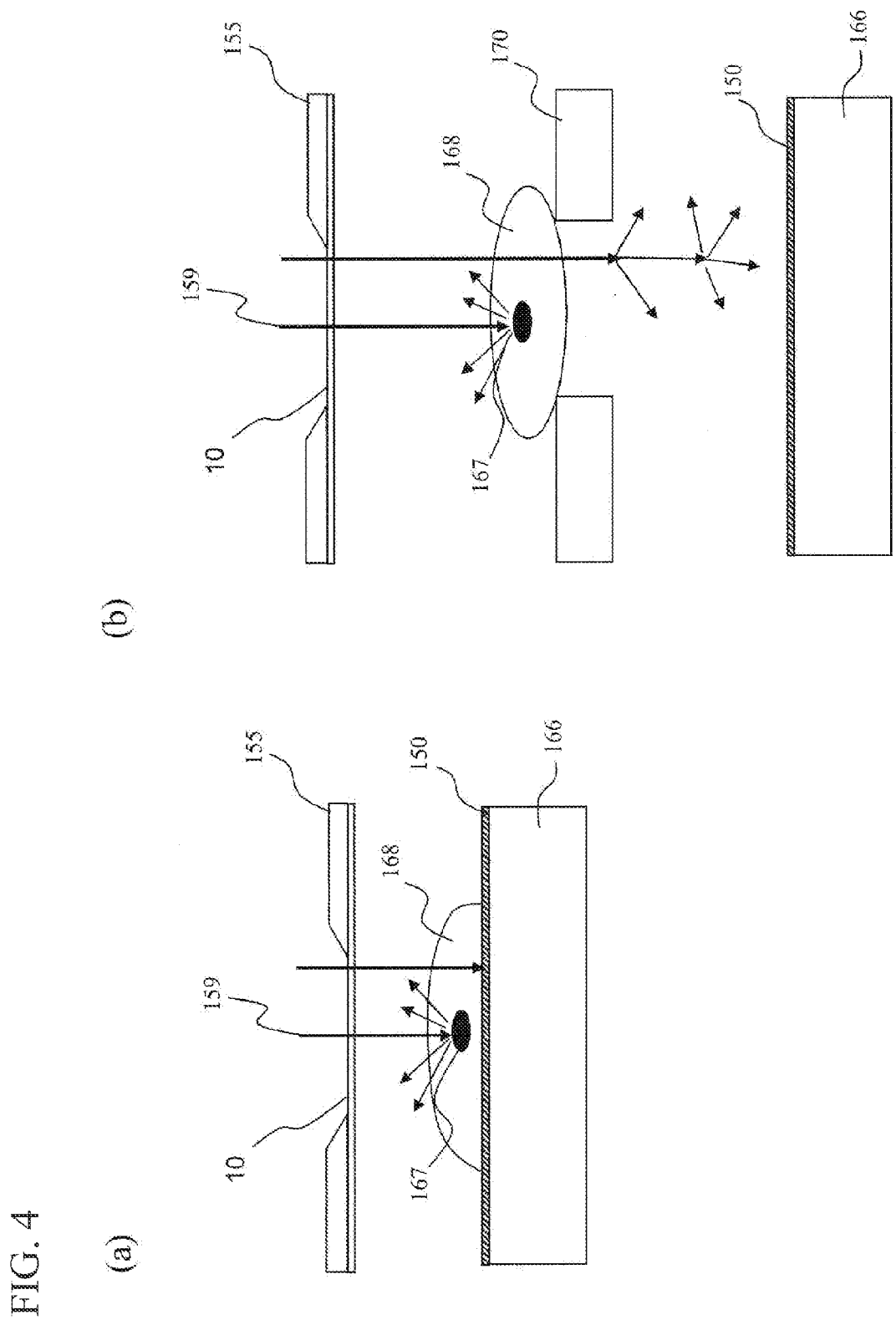
FIGS. 4A and 4B are diagrams for describing the trajectory of the charged particle beam and a detector position.

The samples that may be directly mounted on the detector illustrated in FIGS. 3, 4, and 5 include, for example, a liquid or a membrane containing a cell; a liquid biological sample such as blood or urine; a sliced cell; particles in liquid; and fine particles of fungus, mold, or virus and the like. The liquid or liquid medium sample may be mounted by, for example, attaching a membrane containing cells onto the tip of a tool such as a cotton swab, and then applying the swab onto the detector, or by letting it drop from a dropper. In the case of fine particles, the sample may be sprinkled over the detector.

According to the present example, a charged particle microscope that can observe the inside of the sample and that can perform observation under the atmospheric pressure can be realized.

SECOND EXAMPLE

In the present example, an example of application to a charged particle microscope will be described. Examples of the charged particle microscope include a scanning electron microscope and an ion microscope. In the following, description of portions similar to those of the first example will be omitted.

Figure 6:
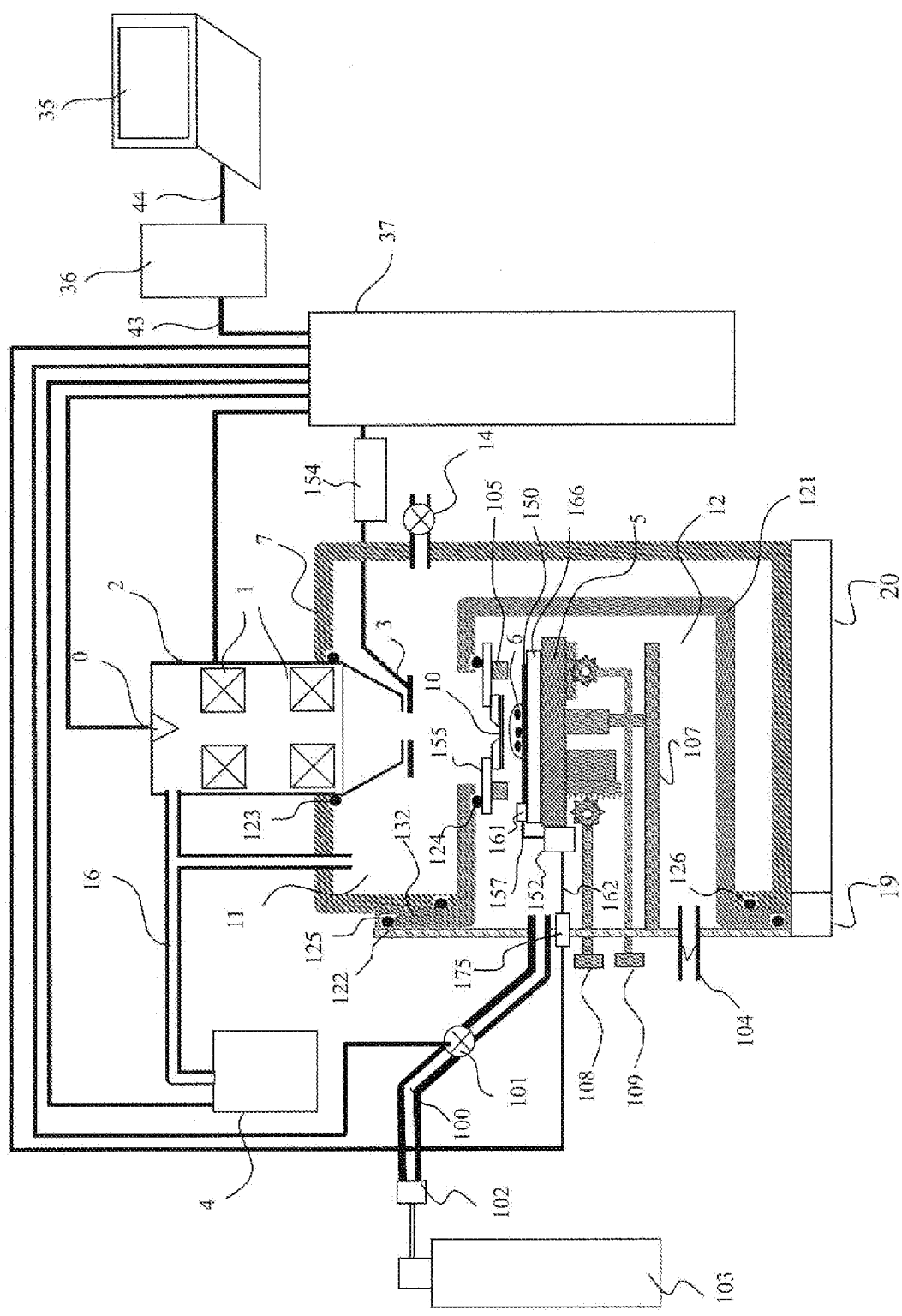
FIG. 6 is a configuration example of the charged particle microscope according to a second example.

FIG. 6 is an overall configuration diagram of the charged particle microscope according to the present example. As in the first example, the charged particle microscope according to the present example includes the electron optical lens barrel 2; the first housing (vacuum chamber) 7 supporting the electron optical lens barrel with respect to the device installation surface; the second housing (attachment) 121 used by being inserted into the first housing 7; and the control system. Detailed description of operations or functions of the above elements or additional elements added thereto is omitted as they are substantially similar to those of the first example.

The separating film holder member 155 is detachably affixed to the lower surface side of a roof plate of the second housing 121 via a vacuum seal member. The separating film 10 is very thin, such as on the order of 20 μm or less, due to the requirement for transmitting the electron beam. Thus, the separating film 10 could become degraded over time or damaged during a preparation for observation. Also, it is very difficult to directly handle the separating film 10 because of its small thickness. In the present example, however, the separating film 10 can be handled via the separating film holder member 155 rather than directly, greatly facilitating the handling of the separating film 10 (particularly for replacement). Specifically, in the event that the separating film 10 is damaged, the separating film 10 can be replaced together with the separating film holder member 155. In case the separating film 10 needs to be directly replaced, the separating film holder member 155 can be removed outside the device, and then the separating film 10 can be replaced outside the device. Instead of the separating film, an aperture member having a hole of an area of 1 mm$^2$ or less may be used, as in the first example.

Further, the separating film holder member 155 according to the present example is provided with a limiting member 105 on the side opposite the sample 6 that prevents contact between the separating film and the sample. As the limiting member 105, anything may be used as long as it can prevent the distance between the sample and the separating film from becoming equal to or less than a certain distance. For example, an adhesive or a tape may be simply attached and used as the limiting member 105. Preferably, however, in view of the mean free path of the primary electron beam that has passed through the separating film 10, it is preferable to fabricate the limiting member 105 from a thin film material with an accurately known thickness. In FIG. 6, the limiting member 105 is attached to the separating film holder member 155. However, the limiting member 105 may be attached to the separating film 10 itself or to the sample stage 5. Alternatively, the limiting member 105 may be mounted around the sample 6 or on the detector 150. Further preferably, the limiting member 105 may be configured to be detachable.

The detection signal from the detector 150 is sent to the lower-level control unit 37 via the amplifier 152 and a hermetic connector 175 attached to a cover member 122. As will be described below, the second space 12 may be placed in vacuum. Thus, the hermetic connector 175 is preferably a vacuum-sealed hermetic connector that can maintain a vacuum region.

In the case of the charged particle microscope according to the present example, the open surface of the second housing 121 can be covered with the cover member 122, enabling various functions to be realized, as will be described below.

The charged particle microscope according to the present example is provided with the function for supplying substitution gas into the second housing. The electron beam emitted from the lower end of the electron optical lens barrel 2 passes through the first space 11 maintained at high vacuum, passes through the separating film 10 (or an aperture member) illustrated in FIG. 6, and further enters the second space 12 maintained at the atmospheric pressure or in a slightly negative pressure state (with respect to the first space). However, in the lower vacuum space, because the electron beam is scattered by gas molecules, the mean free path becomes shorter. Specifically, when the distance between the separating film 10 and the sample 6 is large, the secondary electrons, reflected electrons, or transmitted electrons produced by the electron beam or the electron beam irradiation fail to reach the sample and the detector 3 or the detector 150. On the other hand, the electron beam scattering probability is proportional to the mass number of the gas molecules. Thus, by substituting the second space 12 with gas molecules having lighter mass number than the atmosphere, the electron beam scattering probability can be decreased, enabling the electron beam to reach the sample. Further, rather than the second space as a whole, at least the atmosphere in the electron beam passing route in the second space may be gas-substituted. As regards the type of the substitution gas, an image S/N improving effect can be obtained using a gas lighter than the atmosphere, such as nitrogen, water vapor and the like; however, a greater image S/N improving effect can be obtained when a gas with lighter mass, such as helium gas or hydrogen gas, is used.

From the above reasons, in the charged particle microscope according to the present example, the cover member 122 is provided with an attaching portion (gas introducing portion) for a gas supply pipe 100. The gas supply pipe 100 is coupled by a coupling portion 102 with a gas tank 103 for introducing the substitution gas into the second space 12. Along the gas supply pipe 100, a gas control valve 101 is disposed to control the flow rate of the substitution gas flowing in the pipe. For this purpose, a signal line is extended from the gas control valve 101 to the lower-level control unit 37, so that the device user can control the flow rate of the substitution gas on an operation screen displayed on a screen of the computer 35.

Because the substitution gas is light element gas, the gas tends to remain in the upper part of the second space 12 and is difficult to be substituted on the lower side. Thus, the cover member 122 may be provided with an opening, on the side lower than where the gas supply pipe 100 is attached, for providing communication between the inside and the outside of the second space. For example, in FIG. 6, an opening is provided at the position where the pressure adjusting valve 104 is attached. In this way, the atmosphere gas can be pushed by the light element gas introduced from the gas introducing portion, and is discharged via the lower opening, whereby the inside of the second housing 121 can be efficiently substituted with the gas. The opening may double as a rough evacuation port which will be described below.

The second housing 121 or the cover member 122 may be provided with an evacuation port so that the inside of the second housing 121 can be once evacuated and then placed in a slightly negative pressure state. In this case, the evacuating only needs to decrease the atmosphere gas components remaining in the second housing 121 to a certain amount or less and does not require high-vacuum evacuation. Thus, rough evacuation is sufficient. After rough evacuation, gas may be introduced via the gas supply pipe 100. The degree of vacuum may be on the order of $10^5$ Pa to $10^3$ Pa, for example. When no gas introduction is performed, the gas tank 103 may be replaced with a vacuum pump and still the slightly negative pressure state can be formed.

In the conventional, so-called low-vacuum scanning electron microscope, the electron beam column and the sample chamber are in communication with each other. Thus, when the degree of vacuum of the sample chamber is lowered and brought closer to the atmospheric pressure, the pressure in the electron beam column is also changed accordingly. As a result, it has been difficult to control the sample chamber to the pressure on the order of $10^5$ Pa (atmospheric pressure) to $10^3$ Pa. According to the present example, the second space and the first space are isolated from each other by the thin film, so that the pressure and type of gas in the second space enclosed by the second housing 121 and the cover member 122 can be freely controlled. Accordingly, the sample chamber can be controlled to the pressure on the order of $10^5$ Pa (atmospheric pressure) to $10^3$ Pa, which has been difficult to achieve. Further, not only is the observation at the atmospheric pressure (approximately $10^5$ Pa) enabled but also the sample state can be observed while the pressure is continuously changed to pressures around the atmospheric pressure.

However, when a sample having moisture content, such as a biological sample, is observed, once the sample is placed in the vacuum state, the moisture content evaporates, and the sample state is changed. Thus, it is preferable to introduce the substitution gas directly from the atmospheric atmosphere. The opening may be covered by the cover member after the substitution gas is introduced, whereby the substitution gas can be effectively contained in the second space 12.

When a three-way valve is mounted at the opening position, the opening can also be used as a rough evacuation port and an exhaust opening for atmosphere leakage. For example, one side of the three-way valve is attached to the cover member 122, one side is attached to the rough evacuation vacuum pump, and a leak valve is attached to the remaining one, whereby the combined exhaust opening can be realized.

Instead of the opening, a pressure adjusting valve 104 may be installed. The pressure adjusting valve 104 has the function of automatically opening its valve when the internal pressure of the second housing 121 reaches the pressure of 1 atmosphere or above. When the pressure adjusting valve with such function is provided, if the internal pressure reaches the pressure of 1 atmosphere or above during the introduction of the light element gas, the valve automatically opens to discharge the atmosphere gas components, such as nitrogen and oxygen, outside the device, whereby the inside of the device can be filled with the light element gas. The gas tank 103 illustrated in the figure may come installed on the charged particle microscope, or it may be attached subsequently by the device user.

A method of adjusting the position of the sample 6 will be described. The charged particle microscope according to the present example is provided with a sample stage 5 as a means for moving the observation field of view. The sample stage 5 includes an XY drive mechanism for the in-plane direction and a Z-axis drive mechanism for the height direction. To the cover member 122, a support plate 107 constituting a bottom plate for supporting the sample stage 5 is attached, with the sample stage 5 being affixed to the support plate 107. The support plate 107 is mounted extending into the second housing 121 toward the surface of the cover member 122 opposite the second housing 121. From the Z-axis drive mechanism and the XY drive mechanism, support shafts extend and are connected to an operating knob 108 and an operating knob 109, respectively. The device user can operate the operating knobs 108 and 109 to adjust the position of the sample 6 in the second housing 121.

The detector 150 is disposed on the stage 5. Generally, the amount of signal from the detector 150 is small, so that the detector 150 and the signal amplifier 152 can be made less subject to disturbance noise by disposing them closer to each other. Further, because the signal amplifier 152 is mounted on the stage, when the stage 5 is moved, the detector 150, the detector holder base 166, and the signal amplifier 152 are also similarly moved together with the sample 6. Thus, the signal line 157, through which a small amount of signal flows, can simply be fixed in place. In this case, however, the signal line 162 needs to be expandable in accordance with the movement of the stage 5, for example.

Figure 7:
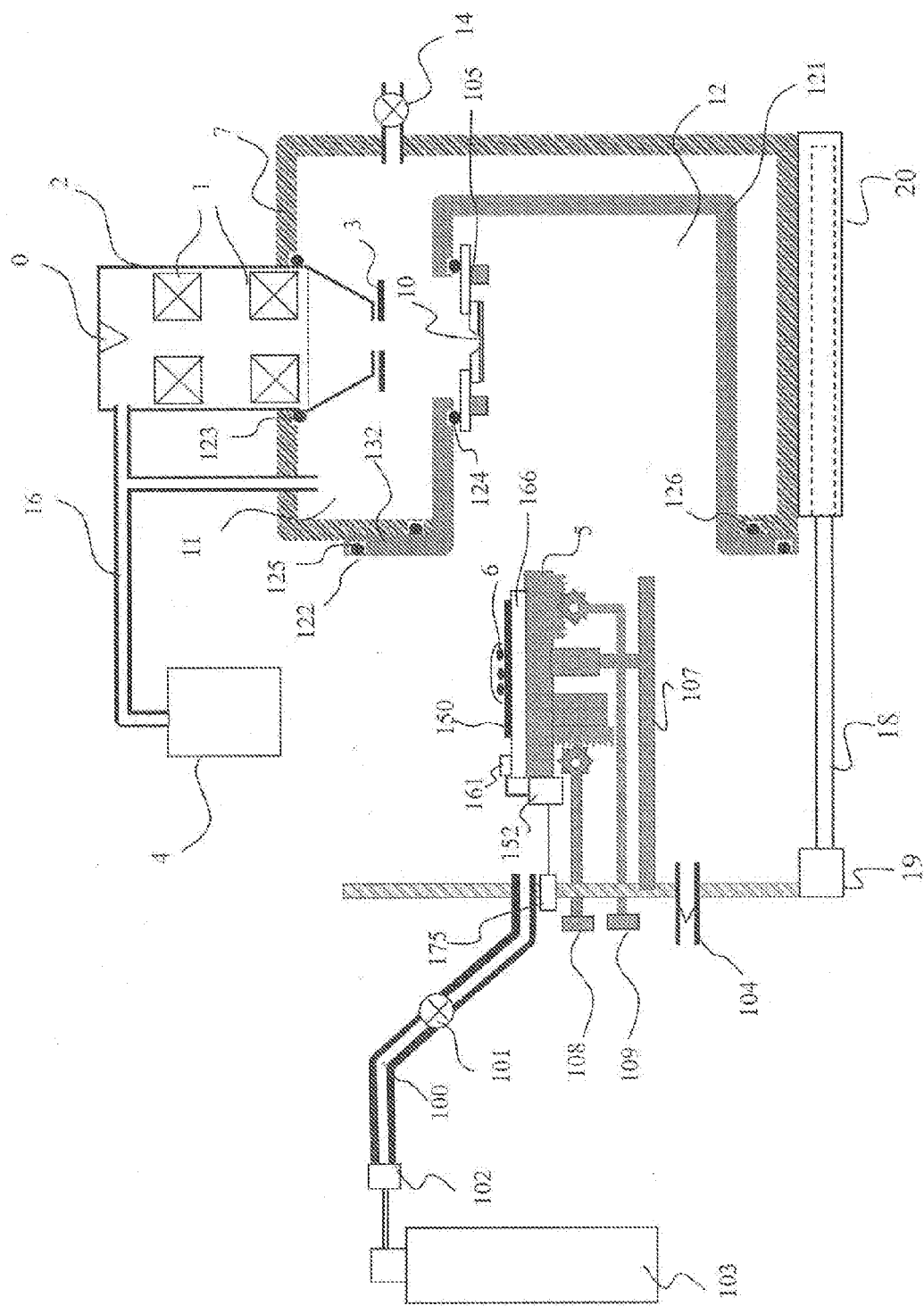
FIG. 7 is a configuration example of the charged particle microscope according to the second example.

A mechanism for replacing the sample 6 will be described. The charged particle microscope according to the present example is provided with a cover member support member 19 and a bottom plate 20 on the bottom surface of the first housing 7 and the lower surface of the cover member 122. The cover member 122 is detachably affixed to the second housing 121 via a vacuum seal member 125. The cover member support member 19 is detachably affixed with respect to the bottom plate 20. Thus, as illustrated in FIG. 7, the cover member 122 and the cover member support member 19 can be entirely removed from the second housing 121. In the figure, electric wiring and the like are omitted.

The bottom plate 20 is provided with a support column 18 used as a guide during removal. In a normal observation state, the support column 18 is stored in a storage portion provided in the bottom plate 20. During removal, the support column 18 can be extended in the direction in which the cover member 122 is drawn out. At the same time, the support column 18 is affixed to the cover member support member 19. Thus, when the cover member 122 is removed from the second housing 121, the cover member 122 and the charged particle microscope body are not completely separated from each other, preventing the sample stage 5 or the sample 6 from falling.

When the sample is loaded into the second housing 121, the Z-axis operating knob of the sample stage 5 is initially rotated so as to distance the sample 6 from the separating film 10. Then, the pressure adjusting valve 104 is opened, opening the inside of the second housing to the atmosphere. After confirming that the inside of the second housing is not in a depressurized state or an extremely pressurized state, the cover member 122 is drawn to the side opposite from the device body, achieving the state in which the sample 6 can be replaced. After the sample is replaced, the cover member 122 is pushed into the second housing 121, the cover member 122 is affixed to the mating portion 132 using a fastening member which is not illustrated, and then the introduction of substitution gas is introduced as needed. The above operation may also be executed in a state where a high voltage is being applied to the optical lens 2 inside the electron optical lens barrel 2, or in a state where the electron beam is being emitted from the electron source 8. Thus, the charged particle microscope according to the present example can start observation quickly after sample replacement.

Figure 8:
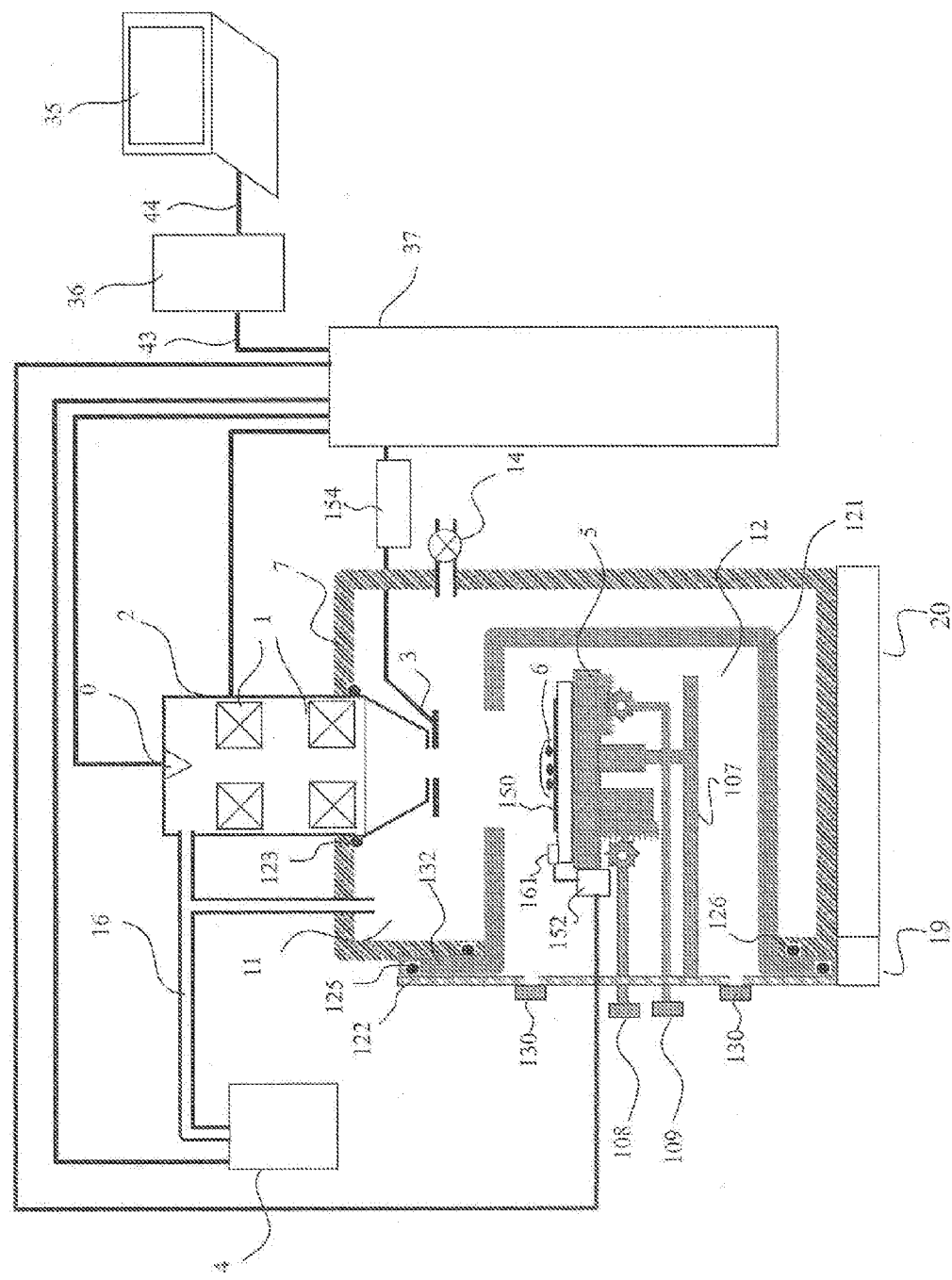
FIG. 8 is a configuration example of the charged particle microscope according to the second example.

The charged particle microscope according to the present example may also be used as a normal high vacuum SEM. FIG. 8 is an overall configuration diagram of the charged particle microscope according to the present example when used as a high vacuum SEM. In FIG. 8, illustration of the control system is omitted as it is similar to that of FIG. 6. FIG. 8 illustrates the charged particle microscope in a state in which, after the gas supply pipe 100 and the pressure adjusting valve 104 have been removed from the cover member 122 with the cover member 122 affixed to the second housing 121, the attaching positions for the gas supply pipe 100 and the pressure adjusting valve 104 have been closed by cover members 130. By removing the separating film 10 and the separating film holder member 155 from the second housing 121 in an earlier or later operation, the first space 11 and the second space 12 can be connected, making it possible to evacuate the inside of the second housing by the vacuum pump 4. Thus, high vacuum SEM observation can be performed with the second housing 121 attached.

Figure 9:
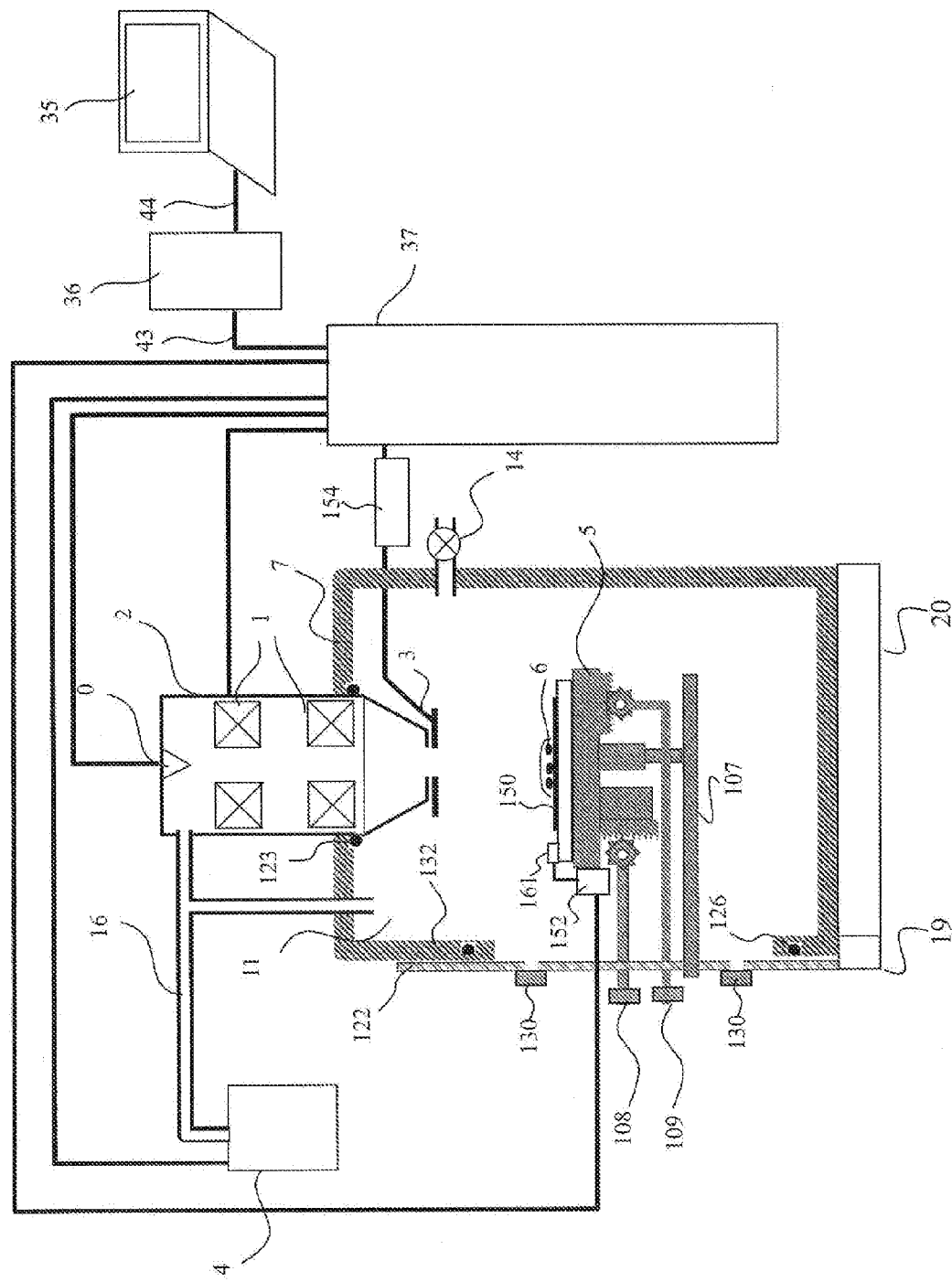
FIG. 9 is a configuration example of the charged particle microscope according to the second example.

In a modification of the configuration of FIG. 8, the second housing 121 with the separating film holder member 155 attached thereto may be entirely removed, and the cover member 122 may be directly affixed to the coupling surface of the first housing 7, as illustrated in FIG. 9. In the present configuration too, the first space 11 and the second space 12 can be connected, so that the inside of the second housing can be evacuated using the vacuum pump 4. This state is the same as the configuration of a general SEM device.

As described above, in the present example, the sample stage 5 with the detector 150 mounted thereon, the operating knobs 108 and 109, the gas supply pipe 100, and the pressure adjusting valve 104 are all collectively mounted to the cover member 122. Thus, the device user can operate the operating knobs 108 and 109, replace the sample, and detach or attach the gas supply pipe 100 or the pressure adjusting valve 104 with respect to the same surface of the first housing. Accordingly, compared with a charged particle microscope configured such that the above constituent elements are separately mounted to other surfaces of the sample chamber, highly increased operability can be obtained when switching states between the state for observation under the atmospheric pressure and the state for observation under high vacuum.

In addition to the above-described configurations, a contact monitor for detecting the state of contact between the second housing 121 and the cover member 122 may be provided so as to monitor whether the second space is closed or opened.

In addition to the secondary electron detector or the reflected electron detector, an X-ray detector or a light detector may be installed so as to enable EDS analysis or fluorescence line detection. The X-ray detector or the light detector may be disposed in either the first space 11 or the second space 12.

A voltage may be applied to the sample stage 5 or the detector 150. When a voltage is applied to the sample 6 or the detector 150, the emitted electrons or transmitted electrons from the sample 6 can be provided with high energy, whereby the signal amount can be increased and the image S/N can be improved.

Thus, according to the present example, an SEM can be realized that can be also used as a high vacuum SEM and that enables simple observation under the atmospheric pressure or a gas atmosphere of a slightly negative pressure state, in addition to providing the effects of the first example. Because observation can be performed by introducing substitution gas, the charged particle microscope according to the present example can perform image acquisition with better S/N than by the charged particle microscope of the first example.

While in the present example, the configuration example intended for a desk-top electron microscope has been described, the present example may be applied to a large-sized charged particle microscope. In the case of a desk-top electron microscope, the device as a whole or the charged particle optical lens barrel is supported on the device installation surface via a housing. In the case of a large-sized charged particle microscope, the device as a whole may be placed on a mount base. Thus, by placing the first housing 7 on the mount base, the configuration described with reference to the present example can be used for the large-sized charged particle microscope as is.

THIRD EXAMPLE

Figure 10:
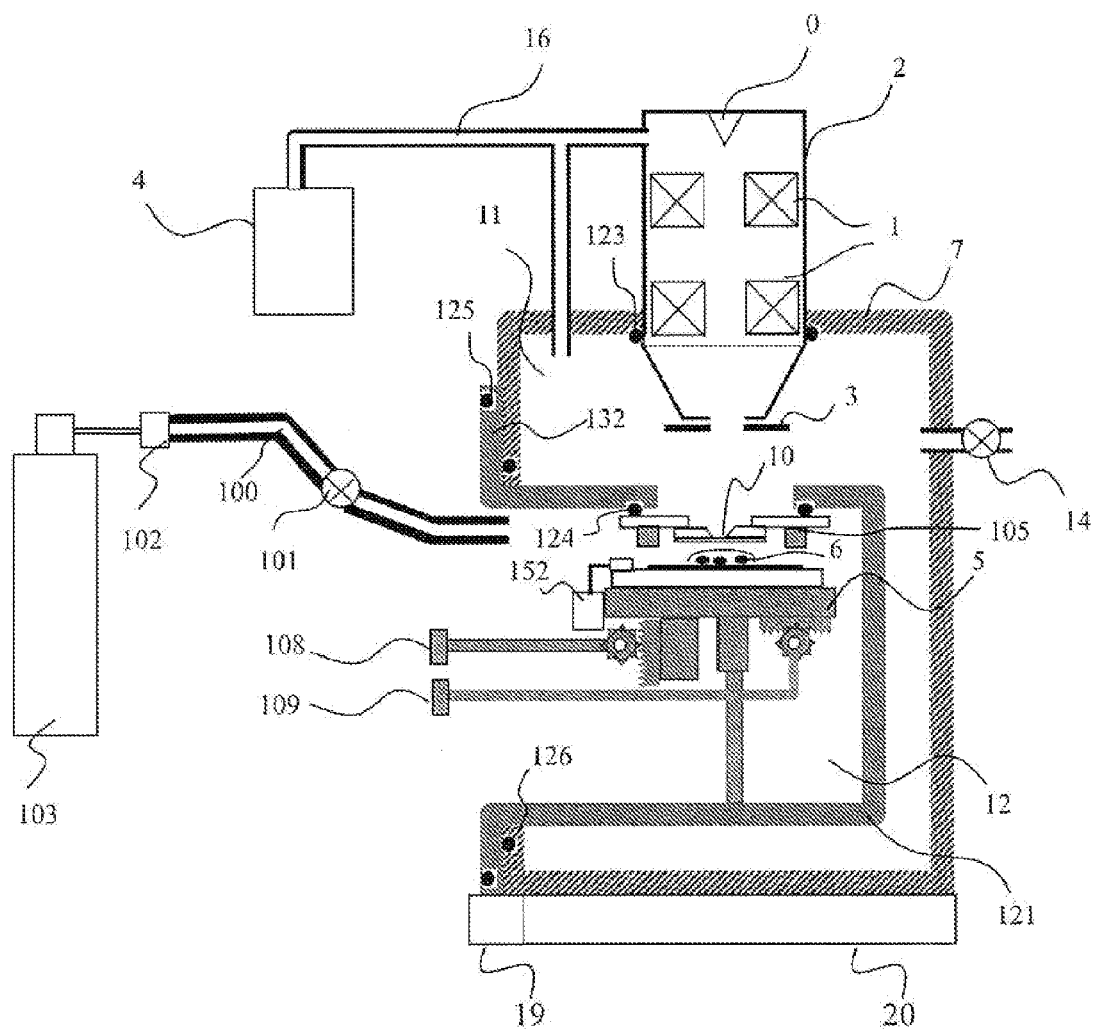
FIG. 10 is an overall configuration diagram of the charged particle microscope according to a third example.

In the present example, a configuration example will be described in which the cover member 122 is removed from the device configuration of FIG. 6. In the following, description of portions similar to those of the first or the second example will be omitted. FIG. 10 illustrates an overall configuration of the charged particle microscope according to the present example. Description of the control system is omitted as it is similar to that of the second example, and only the main portions of the device are illustrated in the figure.

In the configuration illustrated in FIG. 10, the sample stage 5 is directly affixed to the bottom surface of the second housing 121. The gas supply pipe 100 may or may not be affixed to the second housing 121. According to the present configuration, the sample is permitted to extend outside the device, so that a larger sample can be observed than is possible with the configuration of the second example provided with the cover member 122.

FOURTH EXAMPLE

In the present example, a modification of the device configuration of FIG. 2 will be described in which the second housing 121 is vacuum-sealed on the upper side of the first housing. In the following, description of portions similar to those of the first, the second, or the third example will be omitted.

Figure 11:
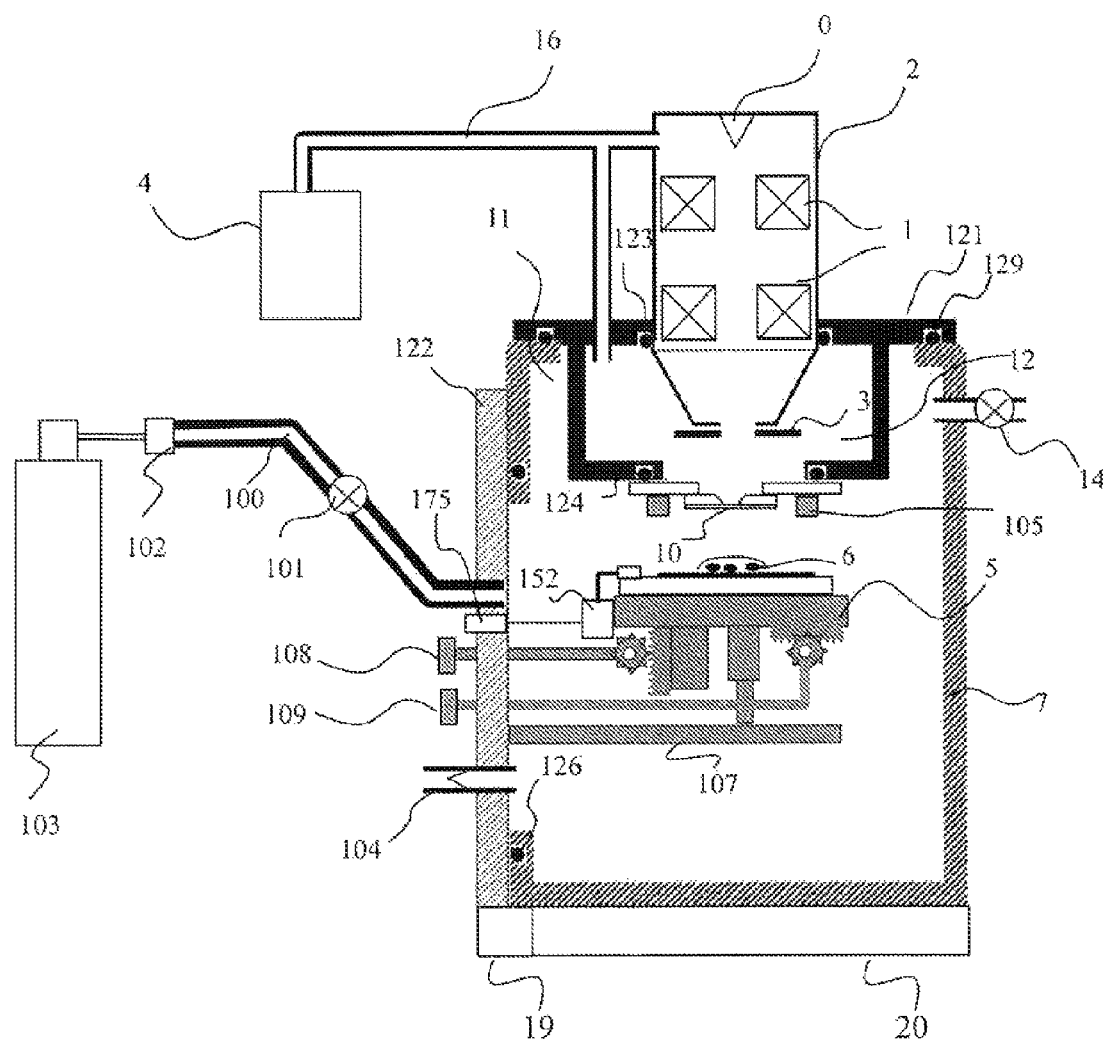
FIG. 11 is an overall configuration diagram of the charged particle microscope according to a fourth example.

FIG. 11 illustrates an overall configuration of the charged particle microscope according to the present example. As in the third example, FIG. 11 illustrates only the main portions of the device. In the present configuration, a pot-shaped attachment (the second housing 121) is used and fitted in the first housing 7 from above, and the electron optical lens barrel 2 is further fitted in the attachment from above. The attachment, when attached to the first housing, protrudes into the first housing 7, which is cuboidal. In this state, the closed space (the first space 11) formed by the inner wall surfaces of the first housing 7, the outer wall surfaces of the second housing, and the separating film 10 provides an atmospheric pressure state space, while the inside of the second housing 121 (the second space 12) provides an evacuated space.

The second housing 121 is vacuum-sealed by the vacuum seal member 123 with respect to the electron optical lens barrel 2. Further, the second housing 121 is vacuum-sealed by the vacuum seal member 129 with respect to the first housing 7. In the case of this configuration, compared with FIG. 6, the volume of the second space 12 can be increased, so that a larger sample can be disposed than is possible with the configuration of the second example.

The present invention is not limited to the foregoing examples and includes various modifications. The foregoing examples have been described in detail for the purpose of facilitating an understanding of the present invention, and are not limited to include all of the described elements. Some of the elements of one example may be replaced with the elements of another example, or the elements of the other example may be added to the elements of the one example.

With respect to some of the elements of each example, addition of other elements, deletion, or substitution may be possible. Some or all of the elements, functions, processing units, processing means and the like may be designed in the form of an integrated circuit, for example, for hardware implementation. Alternatively, the elements, functions and the like may be implemented as software in the form of a program for realizing the functions that is interpreted and executed by a processor.

Information of the program for realizing the functions, tables, files and the like may be placed in a recording device, such as a memory, a hard disk, or a solid state drive (SSD), or in a record medium, such as an IC card, an SD card, or a DVD.

The illustrated control lines or information lines are only those considered necessary for description purpose, and do not necessarily indicate all of the control lines or information lines required in a product. It may be considered that in practice, most of the elements are mutually connected.

REFERENCE SIGNS LIST

1 Optical lens
2 Electron optical (charged particle optical) lens barrel
3 Detector
4 Vacuum pump
5 Sample stage
6 Sample
7 First housing
8: Electron source (charged particle source)
9 Open surface
10 Separating film
11 First space
12 Second space
14 Leak valve
16 Vacuum piping
17 Sample base
18 Support column
19 Cover member support member
20 Bottom plate
35 Computer
36 Upper-level control unit
37 Lower-level control unit
43, 44 Communication lines
100 Gas supply pipe
101 Gas control valve
102 Coupling portion
103 Gas tank
104 Pressure adjusting valve
105 Limiting member
106 Camera
107 Support plate
108, 109 Operating knob
121 Second housing
122, 130 Cover member
123, 124, 125, 126, 128, 129 Vacuum seal member
131 Body portion
132 Mating portion
150 Detector
152, 153, 154 Signal amplifier
155 Separating film holder member
156, 157, 158 Signal line
159 Primary charged particle beam
160, 161 Connector
162, 163 Signal line
164 Metal pad
165 Tapered portion
166 Detector holder base
167 High density portion in sample
168 Low density portion in sample
169 Convex member
170 Support base
171 Meshed member
172 Foil or film
173 Hermetic connector
174 Vacuum-seal portion
175 Hermetic connector

The invention claimed is:

1. A charged particle beam device comprising:
   a charged particle optical lens barrel that irradiates and scans a sample with a focused primary charged particle beam;
   a vacuum pump that evacuates the inside of the charged particle optical lens barrel;
   a detector that detects a transmitted charged particle beam obtained by the irradiation of the sample with the charged particle beam;
   a sample stage that moves the sample in an in-plane direction or a height direction; and
   a signal amplifier disposed inside the charged particle beam device separately from the detector,
   wherein the detector is disposed on the sample stage, and at least a part or all of the sample is placed on the detector directly or indirectly.

2. The charged particle beam device according to claim 1, comprising a detachable separating film that is disposed to isolate a space in which the sample is placed from the charged particle optical lens barrel, and that transmits or passes the primary charged particle beam,
   wherein the detector is placed on an opposite side of the separating film with respect to the sample.

3. The charged particle beam device according to claim 2, comprising:
   a first housing supporting the charged particle beam device as a whole with respect to a device installation surface, the inside of the first housing being evacuated by the vacuum pump; and
   a second housing fixedly positioned on a side surface or an inner wall surface of the first housing, or on the charged particle optical lens barrel, the second housing storing the sample inside,
   wherein:
   the separating film is disposed on an upper surface side of the second housing; and
   the second housing has an internal pressure maintained to be equivalent to an internal pressure of the first housing, or the internal pressure of the second housing is maintained in a higher state than the internal pressure of the first housing.

4. The charged particle beam device according to claim 1, wherein the sample is placed on the detector via a foil, a film, or a mesh.

5. The charged particle beam device according to claim 1, wherein the distance from the sample to a detection element of the detector is equal to or less than 1 mm.

6. The charged particle beam device according to claim 1, wherein the detector is detachable with respect to the charged particle beam device.

7. The charged particle beam device according to claim 1, wherein the detector includes a detection element formed from a semiconductor material, and detects an electric signal obtained from the detection element.

8. The charged particle beam device according to claim 1, wherein the detector is a scintillator that converts the transmitted charged particle beam into light.

9. The charged particle beam device according to claim 1, wherein a distance between the signal amplifier and the detector is invariable regardless of the position of the detector with respect to the separating film.

10. The charged particle beam device according to claim 1, wherein the signal amplifier is installed on the sample stage.

11. The charged particle beam device according to claim 3, wherein:
- the second housing has a cuboidal shape with one side surface being opened;
- the device includes a cover member covering the opened side surface; and
- a stage provided with the detector is affixed to the cover member.

12. The charged particle beam device according to claim 2, comprising a gas introduction opening configured to substitute an atmosphere in a space at least between the separating film and the sample with a gas other than air.

13. The charged particle beam device according to claim 2, wherein an atmosphere in the space in which the sample is placed can be controlled to a pressure of not less than $10^3$ Pa and not more than an atmospheric pressure.

14. A sample observation method for observing a sample by irradiating and scanning the sample with a focused primary charged particle beam using a charged particle beam device, and detecting a transmitted charged particle signal obtained by the irradiating,
comprising:
- arranging a detector on a sample stage that moves in an in-plane direction or a height direction, wherein at least a part or all of the sample is directly or indirectly placed on the detector;
- detecting, using the detector,
- the transmitted charged particle beam obtained by irradiating the sample with the primary charged particle beam; and
- amplifying a signal from the detector using a signal amplifier disposed inside the charged particle beam device separately from the detector.

15. The sample observation method according to claim 14, comprising:
- causing the primary charged particle beam generated in a charged particle optical lens barrel maintained in a vacuum state to be transmitted or passed through a separating film disposed to isolate a space in which the sample is placed from the charged particle optical lens barrel; and
- irradiating the sample placed in an atmosphere of a pressure of not less than $10^3$ Pa and not more than an atmospheric pressure with the primary charged particle beam.

16. The sample observation method according to claim 15, comprising disposing the sample directly or indirectly on the detector for the transmitted charged particle beam, bringing the detector with the sample mounted thereon closer to the separating film, and then irradiating the sample with the primary charged particle beam.

17. The sample observation method according to claim 15, comprising substituting an atmosphere in a space at least between the separating film and the sample with a gas other than air.

18. The sample observation method according to claim 14, wherein the detector is a scintillator that converts the transmitted charged particle beam into light.

* * * * *